United States Patent
Hartner et al.

(10) Patent No.: US 11,764,453 B2
(45) Date of Patent: Sep. 19, 2023

(54) RF DEVICES INCLUDING AN RF CHIP HAVING AN ELECTRICAL REDISTRIBUTION LAYER WITH RF ANTENNAS FORMED THEREIN AND METHODS OF MANUFACTURE

(71) Applicant: Infineon Technologies AG, Neubiberg (DE)

(72) Inventors: Walter Hartner, Bad Abbach-Peissing (DE); Bernhard Rieder, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/302,468

(22) Filed: May 4, 2021

(65) Prior Publication Data
US 2021/0359387 A1 Nov. 18, 2021

(30) Foreign Application Priority Data
May 15, 2020 (DE) .......................... 102020113232.8

(51) Int. Cl.
*H01P 5/107* (2006.01)
*H01P 5/02* (2006.01)
*H01L 23/66* (2006.01)

(52) U.S. Cl.
CPC .............. *H01P 5/107* (2013.01); *H01L 23/66* (2013.01); *H01P 5/02* (2013.01); *H01L 2223/6627* (2013.01)

(58) Field of Classification Search
CPC ...................................................... H01P 5/107
USPC .......................................................... 333/26
See application file for complete search history.

(56) References Cited

U.S. PATENT DOCUMENTS

| | | | |
|---|---|---|---|
| 9,356,352 B2 * | 5/2016 | Seok et al. | H05K 3/4644 |
| 2014/0285389 A1 | 9/2014 | Fakharzadeh et al. | |
| 2014/0320231 A1 | 10/2014 | Seler et al. | |
| 2015/0171033 A1 | 6/2015 | Seler et al. | |
| 2016/0043455 A1 * | 2/2016 | Seler et al. | H01P 11/003 29/601 |
| 2016/0118705 A1 | 4/2016 | Tang et al. | |

(Continued)

FOREIGN PATENT DOCUMENTS

| | | |
|---|---|---|
| DE | 112015005575 T5 | 9/2017 |
| DE | 102019118691 A1 | 12/2020 |

*Primary Examiner* — Benny T Lee
(74) *Attorney, Agent, or Firm* — Harrity & Harrity, LLP (57) ABSTRACT

A radio-frequency device comprises an encapsulation material and a radio-frequency chip embedded into the encapsulation material, wherein the radio-frequency chip has a first main surface and a second main surface. The radio-frequency device furthermore comprises an electrical redistribution layer arranged over the first main surface of the radio-frequency chip and the encapsulation material, and a radio-frequency antenna formed in the redistribution layer and configured to emit signals in a direction pointing from the second main surface to the first main surface and/or to receive signals in a direction pointing from the first main surface to the second main surface. The radio-frequency device furthermore comprises a microwave component having an electrically conductive wall structure, the microwave component being arranged below the radio-frequency antenna and embedded into the encapsulation material.

25 Claims, 5 Drawing Sheets

(56) References Cited

U.S. PATENT DOCUMENTS

2016/0293557 A1    10/2016   Topak et al.
2020/0400815 A1    12/2020   Wintermantel
2021/0075081 A1*   3/2021   Kamphuis et al. ..... H01L 24/49
2021/0225719 A1    7/2021   Seler et al.

* cited by examiner

RF DEVICES INCLUDING AN RF CHIP HAVING AN ELECTRICAL REDISTRIBUTION LAYER WITH RF ANTENNAS FORMED THEREIN AND METHODS OF MANUFACTURE

CROSS REFERENCE TO RELATED APPLICATION

This application claims priority to German Patent Application No. 102020113232.8 filed on May 15, 2020, the content of which is incorporated by reference herein in its entirety.

TECHNICAL FIELD

The present disclosure generally relates to radio-frequency (RF) technology. For example, the present disclosure relates to radio-frequency devices and associated production methods.

BACKGROUND

RF devices can be used in automotive safety applications, for example. By way of example, radar sensors can be used for blind spot detection, automated speed regulation, collision avoidance systems, etc. In one known approach, the RF signals provided by an RF device can be emitted by antennas arranged on a printed circuit board. For this purpose, the printed circuit board generally has to have an expensive RF laminate for the RF signal paths. Furthermore, in this approach, transport losses can occur during signal transfer between the RF chip and the RF antennas.

SUMMARY OF THE INVENTION

Implementations described herein may provide cost-effective RF devices having low power losses and associated production methods. Various aspects relate to a radio-frequency device. The radio-frequency device comprises an encapsulation material. The radio-frequency device furthermore comprises a radio-frequency chip embedded into the encapsulation material, wherein the radio-frequency chip has a first main surface and a second main surface. The radio-frequency device furthermore comprises an electrical redistribution layer arranged over the first main surface of the radio-frequency chip and the encapsulation material. The radio-frequency device furthermore comprises a radio-frequency antenna formed in the redistribution layer and configured to emit signals in a direction pointing from the second main surface to the first main surface and/or to receive signals in a direction pointing from the first main surface to the second main surface. The radio-frequency device furthermore comprises a microwave component having an electrically conductive wall structure, the microwave component being arranged below the radio-frequency antenna and embedded into the encapsulation material.

Various aspects relate to a radio-frequency device. The radio-frequency device comprises a printed circuit board. The radio-frequency device furthermore comprises a semiconductor package embedded into the printed circuit board. The semiconductor package comprises an encapsulation material. The semiconductor package furthermore comprises a radio-frequency chip embedded into the encapsulation material. The semiconductor package furthermore comprises an electrical redistribution layer arranged over the radio-frequency chip and the encapsulation material. The semiconductor package furthermore comprises a radio-frequency antenna formed in the redistribution layer.

Various aspects relate to a radio-frequency device. The radio-frequency device comprises a printed circuit board. The radio-frequency device furthermore comprises a radio-frequency chip embedded into the printed circuit board without a package. The radio-frequency device furthermore comprises a radio-frequency antenna arranged on the radio-frequency chip.

Various aspects relate to a method for producing a radio-frequency device. The method comprises fabricating a semiconductor device. The semiconductor device comprises a radio-frequency chip. The semiconductor device furthermore comprises a radio-frequency antenna arranged in the semiconductor device. The method furthermore comprises embedding the fabricated semiconductor device into a printed circuit board.

Various aspects relate to a method for producing a radio-frequency device. The method comprises embedding a radio-frequency chip into an encapsulation material. The method furthermore comprises forming a microwave component having an electrically conductive wall structure in the encapsulation material. The method furthermore comprises forming an electrical redistribution layer over the radio-frequency chip and the encapsulation material. The method furthermore comprises forming a radio-frequency antenna in the redistribution layer and over the microwave component.

BRIEF DESCRIPTION OF THE DRAWINGS

Devices and methods in accordance with the disclosure are explained in greater detail below with reference to drawings. The elements shown in the drawings are not necessarily rendered in a manner true to scale relative to one another. Identical reference signs may designate identical components throughout the drawings and the detail description.

DETAILED DESCRIPTION OF THE INVENTION

In the following detailed description, reference is made to the accompanying drawings, which show for illustration purposes specific aspects and implementations in which the disclosure can be implemented in practice. In this context, direction terms such as, for example, "at the top", "at the bottom", "at the front", "at the back", etc. can be used with respect to the orientation of the figures described. Since the components of the implementations described can be positioned in different orientations, the direction terms can be used for illustration purposes and may not be restrictive in any way whatsoever. Other aspects can be used and structural or logical changes can be made, without departing from the concept of the present disclosure. In other words, the following detailed description should not be understood in a restrictive sense.

Schematic views of RF devices in accordance with the disclosure are described below. In this case, the RF devices can be illustrated in a general way in order to describe aspects of the disclosure qualitatively. The RF devices can in each case have further aspects that are not illustrated in the figures for the sake of simplicity. For example, the respective RF devices can be extended by any aspects described in association with other devices or methods in accordance with the disclosure.

Figure 1:
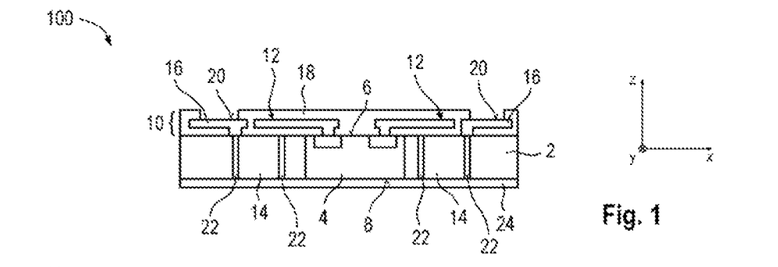
FIG. 1 schematically shows a cross-sectional side view of an RF device in accordance with the disclosure.

FIG. 1 schematically shows a cross-sectional side view of an RF device 100 in accordance with the disclosure. The RF device 100 can comprise an encapsulation material 2 and an RF chip 4 embedded into the encapsulation material 2. The RF chip 4 can have a first main surface 6 and a second main surface 8 situated opposite to the first main surface 6. An electrical redistribution layer (or redistribution wiring layer) 10 can be arranged over the first main surface 6 of the RF chip 4 and the encapsulation material 2. At least one RF antenna 12 can be formed in the redistribution layer 10. The RF antenna 12 can be configured to emit signals in a direction pointing from the second main surface 8 to the first main surface 6 and/or to receive signals in a direction pointing from the first main surface 6 to the second main surface 8. Two RF antennas 12 are shown by way of example in FIG. 1. However, the RF device 100 can have further RF antennas, which may not be visible due to the cross-sectional side view chosen. In further examples, the RF device 100 can have any desired number of RF antennas, which can each be configured as a receiving and/or transmitting antenna. The RF device 100 can furthermore have one or more microwave components 14 having an electrically conductive wall structure 22. In this case, the respective microwave component 14 can be arranged below the respective RF antenna 12 and can be embedded into the encapsulation material 2. As viewed in the z-direction, a microwave component 14 and the RF antenna 12 arranged thereover can at least partly overlap.

The RF chip 4 and the microwave component 14 can each be at least partly embedded into the encapsulation material 2. That is to say that the encapsulation material 2 can form a package of the RF device 100. In this context, the RF device 100 can also be referred to as a "semiconductor package" or "RF package". In the example in FIG. 1, the side surfaces of the RF chip 4 and the side surfaces of the microwave component 14 can be covered by the encapsulation material 2. The encapsulation material 2 can protect the RF chip 4 and the microwave component 14 against external influences, such as moisture, leakage currents or mechanical impacts, for example. The encapsulation material 2 can include for example at least one from a mold compound, a laminate, an epoxy, a filled epoxy, a glass-fiber-filled epoxy, an imide, a thermoplastic, a thermosetting polymer, a polymer mixture.

The RF chip 4 can comprise or correspond to a monolithic microwave integrated circuit (MIMIC), in particular. The RF chip 4 can operate in various frequency ranges. Accordingly, the RF antennas 12 electrically coupled to the RF chip 4 can be configured to emit and/or to receive signals having frequencies in the various frequency ranges. In one example, the RF chip 4 can operate in a radio-frequency or microwave frequency range that can generally range from approximately 10 GHz to approximately 300 GHz. By way of example, accordingly, circuits integrated into the RF chip 4 can operate in a frequency range of greater than approximately 10 GHz, and the RF antennas 12 can emit and/or receive signals having a frequency of greater than approximately 10 GHz. Microwave circuits of this type can comprise for example microwave transmitters, microwave receivers, microwave transceivers, microwave sensors or microwave detectors. The RF devices described herein can be used for example for radar applications in which the frequency of the RF signal can be modulated. Radar microwave devices can be used for example in automotive or industrial applications for distance determining/distance measuring systems. By way of example, automatic vehicle speed regulating systems or vehicle anticollision systems can operate in the microwave frequency range, for example in frequency bands of 76 GHz to 77 GHz and of 77 GHz to 81 GHz.

Alternatively or additionally, the RF chip 4 can operate in a Bluetooth frequency range. Such a frequency range can comprise for example an ISM (Industrial, Scientific and Medical) band between approximately 2.402 GHz and approximately 2.480 GHz. The RF chip 4 or circuits integrated into the RF chip 4 can accordingly more generally be configured to operate in a frequency range of greater than approximately 1 GHz, and the RF antennas 12 can accordingly be configured to emit and/or to receive signals having a frequency of greater than approximately 1 GHz.

The redistribution layer 10 can have one or more electrically conductive structures 16 in the form of metal layers or metal tracks, which can run substantially parallel to the top sides of the RF chip 4 and/or of the encapsulation material 2. The metal layers 16 can be fabricated from copper or a copper alloy, for example. One or more dielectric layers 18 can be arranged between the metal layers 16 in order to electrically insulate the metal layers 16 from one another. The dielectric layers 18 can be fabricated from a material such as an oxide and/or a nitride, for example. Furthermore, metal layers 16 arranged on different planes can be electrically connected to one another by a multiplicity of through contacts or vias.

The metal layers 16 of the redistribution layer 10 can fulfill the function of redistribution or redistribution wiring and be configured to provide connections of the RF chip 4 at other positions of the RF device 100. In the example in FIG. 1, for example, connections of the RF chip 4 can be electrically coupled to electrical contact pads 20 by way of the redistribution layer 10. Circuits integrated into the RF chip 4 can be electrically contacted from outside the RF device 100 by way of the electrical contact pads 20. In this case, the electrical contact pads 20 can have in particular a larger area than contact pads of the connections of the RF chip 4. Enlargement and electrical redistribution of the connections of the RF chip 4 may be advantageous during later embedding of the RF device 100 into a printed circuit board (cf. FIG. 2). By way of example, the enlarged electrical contact pads 20 can function as stop layers when holes are formed in the printed circuit board using a laser process.

In the example in FIG. 1, the redistribution layer 10 can redistribute the connections of the RF chip 4 to the electrical contact pads 20, which can be arranged outside the contour of the RF chip 4 as viewed in the z-direction. An RF device 100 having such a spreading-out of the chip connections can be referred to as a "Fan-Out" device or "Fan-Out" package. In the example in FIG. 1, the RF device 100 can be a wafer level package, which can be produced in accordance with an eWLB (embedded Wafer Level Ball Grid Array) method. In this type of package, the top sides of the RF chip 4 and of the encapsulation material 2 can lie in a common plane, e.g. can be arranged in a coplanar fashion, due to the production process. However, RF devices in accordance with the disclosure are not restricted to a specific type of semiconductor package. A further example type of package in an RF device in accordance with the disclosure is shown and described in FIG. 8.

One or more of the metal layers 16 can be configured to provide one or more electronic components (or functional elements) in the redistribution layer 10. The electronic components can comprise passive electronic components, in particular. A passive electronic component can comprise for example one or more of the following: resistor, capacitor, inductive component (e.g. inductance or coil), etc. In the example in FIG. 1, the RF antennas 12, in particular, can be formed from the metal layers 16 of the redistribution layer 10. In this case, the respective RF antenna 12 can be formed for example as a dipole antenna, an array of two dipole antennas, a coplanar patch antenna, a slot antenna, a Vivaldi antenna, etc. As viewed in the z-direction, the RF antennas 12 can be arranged outside the contour of the RF chip 4, for example.

The microwave component 14 can be at least partly embedded into the encapsulation material 2. In one example, the microwave component 14 can be a prefabricated insert that has been embedded into the encapsulation material 2. Such an insert can be fabricated from a material similar to the encapsulation material 2, for example. In a further example, the microwave component 14 can be produced directly in the encapsulation material 2 after the encapsulation material 2 has been formed.

The microwave component 14 can have at least one electrically conductive wall structure 22. In this case, the electrically conductive wall structure 22 can form in particular side walls of the microwave component 14. As viewed in the z-direction, the electrically conductive wall structure 22 can thus enclose the inner region of the microwave component 14 at least partly, and in particular completely. In other words, the electrically conductive wall structure 22 can form an electrically conductive cage around the inner region of the microwave component 14 and below the RF antenna 12. In further examples, the electrically conductive wall structure 22 can additionally form a base surface of the microwave component 14.

In one example, the electrically conductive wall structure 22 can be an "open structure" and comprise a multiplicity of metallized via holes. The via holes can be formed directly in the encapsulation material 2 and/or in an insert. By way of example, the via holes can be produced in the encapsulation material 2 by laser drilling, and a metallization of the inner walls of the via holes can be produced using a conductive paste plating or metal plating, for example. In a further example, the electrically conductive wall structure 22 can comprise for example a metal lining on a wall of such an insert. In this case, the electrically conductive wall structure 22 can be configured as a grid or network of conductive strips formed on the side walls of the insert. Furthermore, the electrically conductive wall structure 22 can be formed as a continuous metal lining on the side walls of the insert.

The microwave component 14 can form a hollow waveguide extending at least partly into the encapsulation material 2. By way of example, metallized via holes formed in the microwave component 14 can be regarded as a continuation of a hollow waveguide arranged over the microwave component 14, as is shown in FIG. 2, for example.

The microwave component 14 can be or act as an electromagnetic shield. As already described above, an RF antenna 12 arranged over the microwave component 14 can be configured, inter alia, to emit signals in the positive z-direction. During such emission, the RF antenna 12 can also emit portions of electromagnetic radiation in the negative z-direction and also in the x- and y-directions. The microwave component 14 can be configured, in particular, to electromagnetically shield such signal portions emanating from a specific RF antenna 12 vis-à-vis other RF antennas 12 of the RF device 100. Improved isolation or separation of the transmitting and/or receiving channels provided by the RF antennas 12 of the RF device 100 can be provided as a result. An electromagnetic shield provided by the microwave component 14 can be achieved, in particular, if the microwave component 14 and the associated RF antenna 12 at least partly overlap as viewed in the z-direction.

In the example in FIG. 1, the microwave component 14 can extend from the first main surface 6 of the encapsulation material 2 completely through the encapsulation material 2 as far as the opposite second main surface 8 of the encapsulation material 2. Further examples with microwave components 14 formed in different ways are shown and described in FIGS. 3 to 6, for example. In FIG. 1, the wall structure 22 can form side walls of the microwave component 14, but not necessarily a base surface of the microwave component 14. In the example shown, such a base surface can be provided, rather, by a metallization 24 arranged on the second main surface 8 of the encapsulation material 2. The above-described electromagnetic shield provided by the microwave component 14 can be further improved by the metallization 24 or the base surface formed thereby. Alternatively or additionally, the metallization 24 can provide a thermal connection and be configured to dissipate heat generated by the RF chip 4.

Figure 2:
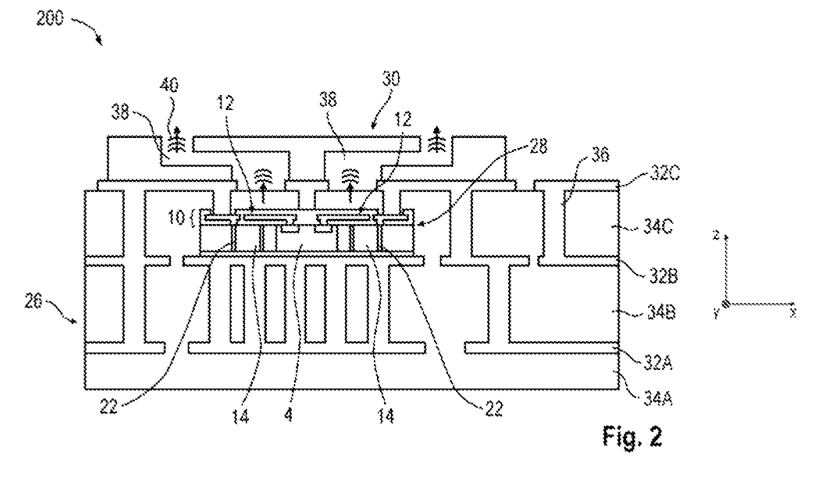
FIG. 2 schematically shows a cross-sectional side view of an RF device in accordance with the disclosure.

FIG. 2 schematically shows a cross-sectional side view of an RF device 200 in accordance with the disclosure. The RF device can comprise a printed circuit board 26, a semiconductor package 28 embedded into the printed circuit board 26, and a waveguide component 30 arranged over the top side of the printed circuit board 26. The semiconductor package 28 in FIG. 2 can be similar to the RF device 100 in FIG. 1, for example, and so in this regard reference can be made to explanations concerning FIG. 1.

The printed circuit board 26 can contain one or more electrically conductive structures (32A, 32B, and 32C, collectively referred to as 32) in the form of metal layers or metal tracks, which can run substantially in the x-direction. The one or more electrically conductive structures 32 can be arranged within the printed circuit board 26 and also on the top side and/or the underside of the printed circuit board 26. The one or more electrically conductive structures 32 arranged on the top side and/or underside of the printed circuit board 26 can form contact pads of the printed circuit board 26, on which electronic components can be mounted. By way of example, the one or more electrically conductive structures 32 can be fabricated from copper or a copper alloy. One or more dielectric layers (34A, 34B, and 34C, collectively referred to as 34) can be arranged between the one or more electrically conductive structures 32 in order to electrically insulate the one or more electrically conductive structures 32 from one another. The dielectric layers 34 can be fabricated for example from a PCB material, such as a fiber-reinforced plastic, in particular a composite material composed of epoxy resin and glass fiber fabric (e.g. FR4). The one or more electrically conductive structures 32 arranged on different planes can be electrically connected to one another by a multiplicity of through contacts 36. The one or more electrically conductive structures 32 can fulfill the function of electrical redistribution or redistribution wiring. In this case, redistribution can be provided within the printed circuit board 26 and/or between the electrical contact pads arranged on the outer sides of the printed circuit board 26.

The semiconductor package 28 can be at least partly embedded in the printed circuit board 26 or encapsulated by the printed circuit board 26. In this case, in particular, all surfaces of the semiconductor package 28 can be covered by the layers of the printed circuit board 26. An electrical contacting of the RF chip 4 from outside the printed circuit board 26 can be provided by way of the one or more electrically conductive structures 32, the through contacts 36 and the redistribution layer 10 of the semiconductor package 28. In the example in FIG. 2, the semiconductor package 28 can be arranged on the topmost inner electrically conductive structure 32B of the printed circuit board 26, for example by way of an adhesive or soldered connection. A small distance between the RF antennas 12 and the upper outer side of the printed circuit board 26 can be provided in this case, thereby making it possible to reduce power losses of signals emitted and/or received in the z-direction in the course of passing through the dielectric layer 34C. A distance between the top side of the semiconductor package 28 and the top side of the printed circuit board 26 can be less than approximately 200 micrometers, more precisely less than approximately 150 micrometers, even more precisely less than approximately 100 micrometers.

The waveguide component 30 can have one or more waveguides 38, each of which can be arranged over one of the RF antennas 12. Each of the RF antennas 12 can be configured to feed or to radiate, into the corresponding waveguide 38 RF signals that are generated by the RF chip 4 and guided to the RF antenna 12. In FIG. 2, example emission of electromagnetic waves by RF antennas 12 in the z-direction into the overlying waveguide 38 is indicated by wavefronts 40 and arrows. Alternatively or additionally, the RF antennas 12 can be configured to receive RF signals radiated into the waveguide 38 from outside the RF device 200, which signals can then be forwarded to the RF chip 4. As viewed in the z-direction, the respective waveguide 38 and the associated RF antenna 12 can at least partly overlap. In this context, the RF antenna 12 can also be referred to as a "Waveguide Feed". An electrical connection between the RF antenna 12 and the RF chip 4 can be provided by the redistribution layer 10 of the semiconductor package 28.

The waveguide component 30 can be mounted on a mounting surface of the printed circuit board 26 and mechanically contact the printed circuit board 26. Due to the semiconductor package 28 being embedded into the printed circuit board 26, the mounting surface can be formed in particular such that the mounting surface is substantially planar. As a result, the waveguide component 30 can be secured flush on the mounting surface and a small distance between the RF antennas 12 and the waveguides 38 can be provided. The RF antennas 12 can thus radiate into the waveguides 38 overlying the RF antennas 12 as losslessly as possible or receive signals by way of the waveguides 38 as losslessly as possible. In the example in FIG. 2, the waveguide component 30 can be arranged in particular over the top side of the printed circuit board 26. A mechanical connection between the printed circuit board 26 and the waveguide component 30 can be provided by one or more from a screw, an adhesive, a solder material, a clamp, a clip, etc.

The waveguide component 30 can be formed integrally or comprise a plurality of parts. The waveguide component 30 can be fabricated from plastic, a ceramic material and/or a dielectric material. In the example in FIG. 2, the waveguides 38 can be formed as hollow waveguides having metallized inner walls. In this case, the hollow waveguides can be filled with air or gas, in particular, e.g. not contain any solid or liquid. In other words, one or more of the waveguides 38 can be "material-free" hollow waveguides. In further examples, the waveguides of RF devices in accordance with the disclosure can alternatively or additionally be formed as dielectric waveguides or substrate integrated waveguides (SIW).

The waveguide component 30 can be formed in a single-layer or multilayered injection-molded plastic assembly, in particular. The at least one waveguide 38 can comprise a metallized hollow waveguide formed in the injection-molded plastic assembly. In the example in FIG. 2, the waveguide component 30 can have hollow waveguide sections extending both vertically and horizontally through the waveguide component 30. In a further example, the waveguide component 30 can have only vertically extending hollow waveguide sections. An example implementation of a horizontal hollow waveguide section in a multilayered injection-molded plastic assembly is shown and described in FIG. 14.

Figure 3:
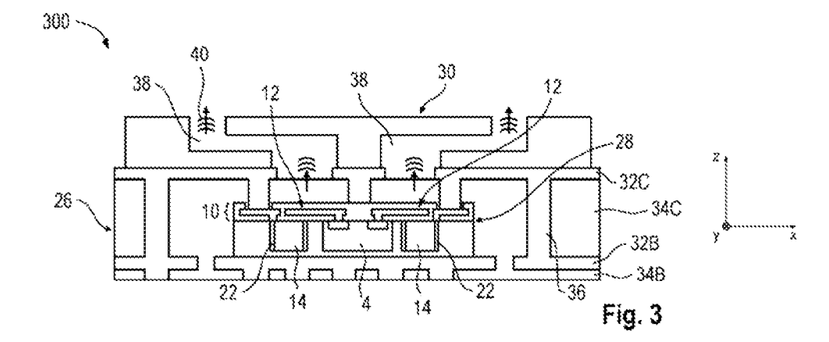
FIG. 3 schematically shows a cross-sectional side view of an RF device in accordance with the disclosure.

FIG. 3 schematically shows a cross-sectional side view of an RF device 300 in accordance with the disclosure. The RF device 300 can be at least partly similar to the RF device 200 in FIG. 2, for example. In contrast to FIG. 2, the semiconductor package 28 in FIG. 3 can have no metallization 24 on the underside thereof. The microwave component 14 can extend from the top side of the encapsulation material only partly into the encapsulation material. The base surface of the microwave component 14 can thus be formed by the encapsulation material. In comparison with FIG. 2, an electromagnetic shielding by the microwave component 14 can be reduced as a result. However, sufficient isolation between the individual channels of the RF device 200 can still be provided by the wall structure 22 of the microwave component 14. In the example in FIG. 3, the underside of the RF chip 4 can be covered by the encapsulation material. The semiconductor package 28 can thus be mounted by way of the encapsulation material on a metal layer of the printed circuit board 26. In comparison with FIG. 2, only a smaller portion of the printed circuit board 26 is illustrated in FIG. 3, for the sake of simplicity.

Figure 4:
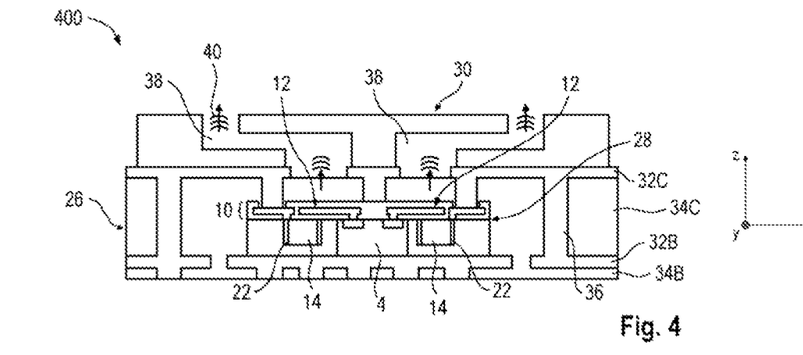
FIG. 4 schematically shows a cross-sectional side view of an RF device in accordance with the disclosure.

FIG. 4 schematically shows a cross-sectional side view of an RF device 400 in accordance with the disclosure. The RF device 400 can be at least partly similar to the RF device 300 in FIG. 3, for example. In contrast to FIG. 3, it is possible for the underside of the RF chip 4 not to be covered by the encapsulation material. Furthermore, a dimension of the microwave component 14 in the z-direction can be reduced. In particular, in the example in FIG. 4, a dimension of the microwave component 14 in the z-direction can be smaller than a corresponding dimension of the RF chip 4.

Figure 5:
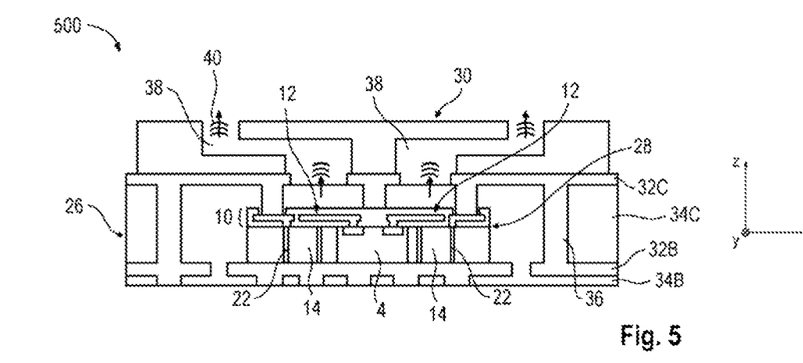
FIG. 5 schematically shows a cross-sectional side view of an RF device in accordance with the disclosure.

FIG. 5 schematically shows a cross-sectional side view of an RF device 500 in accordance with the disclosure. The RF device 500 can be at least partly similar to the RF device 300 in FIG. 3, for example. Analogously to FIG. 3, the RF device 500 can have no rear-side metallization. In contrast to FIG. 3, it is possible for the undersides of the microwave components 14 and of the RF chip 4 not to be covered by the encapsulation material.

Figure 6:
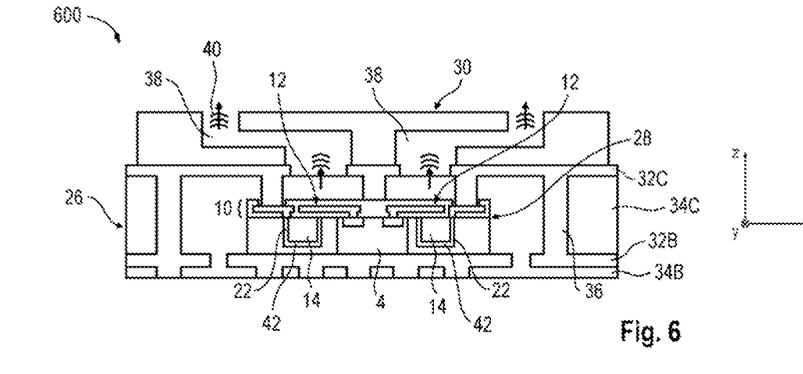
FIG. 6 schematically shows a cross-sectional side view of an RF device in accordance with the disclosure.

FIG. 6 schematically shows a cross-sectional side view of an RF device 600 in accordance with the disclosure. The RF device 600 can be at least partly similar to the RF device 400 in FIG. 4, for example. Analogously to FIG. 4, the microwave component 14 can extend from the top side of the encapsulation material only partly into the encapsulation material. In contrast to FIG. 4, one or more of the microwave components 14 can each have an electrically conductive base surface 42. The base surfaces 42 can be fabricated from a metal (e.g. copper) or a metal alloy, for example. The electrically conductive base surfaces 42 may or may not be regarded as part of the electrically conductive wall structure 22 of the microwave component 14.

Figure 7:
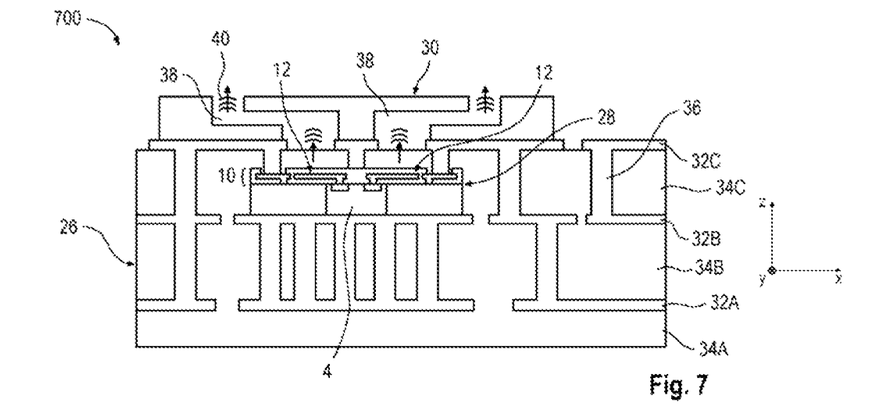
FIG. 7 schematically shows a cross-sectional side view of an RF device in accordance with the disclosure.

FIG. 7 schematically shows a cross-sectional side view of an RF device 700 in accordance with the disclosure. The RF device 700 can be at least partly similar to the RF device 200 in FIG. 2, for example. In contrast to FIG. 2, the RF device 700 can have no microwave components. In comparison with FIG. 2, the probability of crosstalk between channels of the RF device 700 can be increased, while a method for producing the RF device 700 can be simplified.

Figure 8:
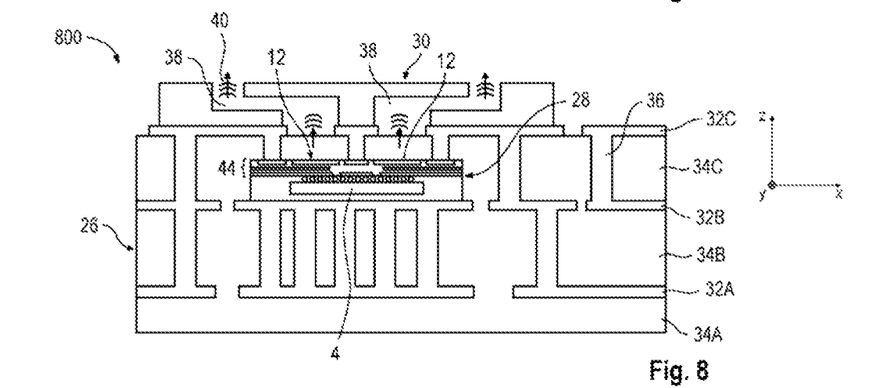
FIG. 8 schematically shows a cross-sectional side view of an RF device in accordance with the disclosure.

FIG. 8 schematically shows a cross-sectional side view of an RF device 800 in accordance with the disclosure. The RF device 800 can be at least partly similar to the RF device 200 in FIG. 2, for example. In contrast to FIG. 2, the RF device 800 can have a different type of semiconductor package. By way of example, the semiconductor package 28 in FIG. 8 can be an FCBGA (Flip Chip Ball Grid Array). The semiconductor package 28 can have a substrate 44, which can be a BGA (Ball Grid Array) substrate. An RF chip 4 can be mounted on the underside of the substrate 44 using a flip-chip technique. In this case, the RF chip 4 can be electrically and mechanically connected to the substrate 44 by way of solder deposits, for example. Signal carrying structures arranged in the substrate 44 can redistribute the connections of the RF chip 4 to the top side of the substrate 44. The RF chip 4 can be electrically contacted from outside the printed circuit board 26 by way of the inner conductive structures of the printed circuit board 26. One or more RF antennas 12 can be formed at the top side of the substrate 44 and can be configured to emit and/or to receive signals in the z-direction. The RF chip 4 can be electrically coupled to the RF antennas 12 by way of the substrate 44.

Figure 9:
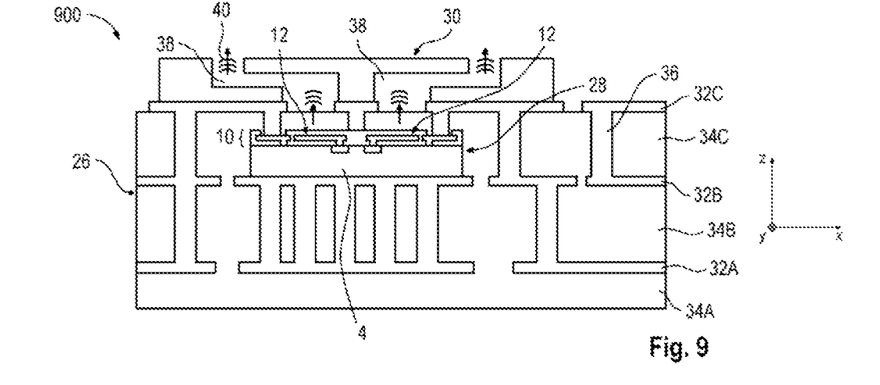
FIG. 9 schematically shows a cross-sectional side view of an RF device in accordance with the disclosure.

FIG. 9 schematically shows a cross-sectional side view of an RF device 900 in accordance with the disclosure. The RF device 900 can be at least partly similar to the RF device 700 in FIG. 7, for example. In contrast to FIG. 7, the RF chip 4 can be a "bare die", e.g. a semiconductor chip without a package. In the example in FIG. 9, one or more RF antennas 12 can be formed in a redistribution layer 10 arranged over the top side of the RF chip 4. In a further example, the RF chip 4 can have no redistribution layer, wherein the RF antennas 12 can be formed directly on the top side of the RF chip 4, for example by front end metallizations.

Figure 10:
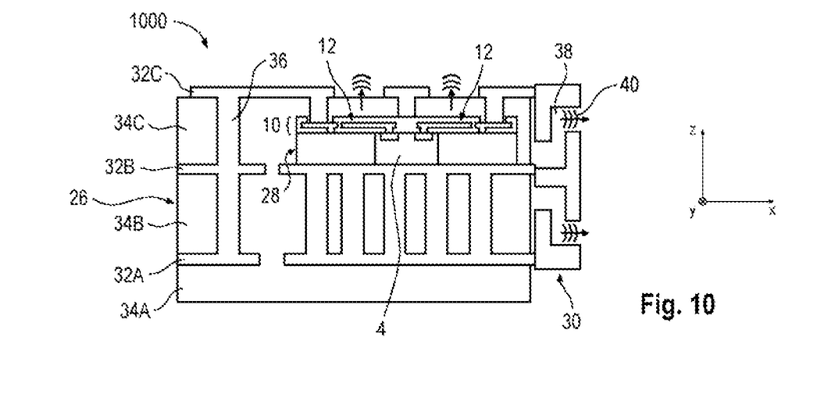
FIG. 10 schematically shows a cross-sectional side view of an RF device in accordance with the disclosure.

FIG. 10 schematically shows a cross-sectional side view of an RF device 1000 in accordance with the disclosure. The RF device 1000 can be at least partly similar to the RF device 700 in FIG. 7, for example. In contrast to FIG. 7, the waveguide component 30 can be mounted on a side surface of the printed circuit board 26. At least one of the RF antennas 12 formed in the redistribution layer 10 can be configured to emit signals and/or to receive signals in a direction parallel to the redistribution layer 10, e.g. in the x- and/or y-direction. Such lateral emission/reception can be provided by a Vivaldi antenna or a Vivaldi-like antenna, for example. As viewed in the lateral direction, the RF antenna 12 and a waveguide 38 of the waveguide component 30 that is arranged over the antenna can at least partly overlap. FIG. 10 is a qualitative illustration that does not show such an overlap for illustrative reasons.

Figure 11:
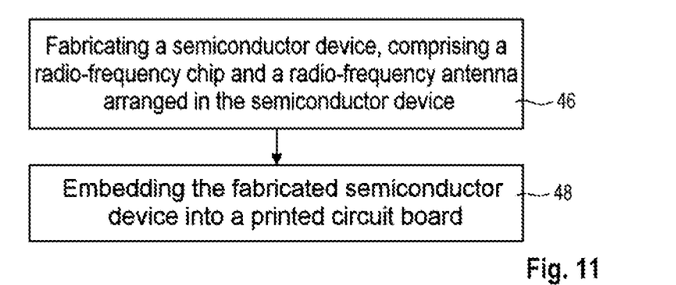
FIG. 11 shows a flow diagram of a method for producing an RF device in accordance with the disclosure.

FIG. 11 shows a flow diagram of a method for producing an RF device in accordance with the disclosure. By way of example, one of the RF devices in FIGS. 2 to 10 can be produced by the method. The method is illustrated in a general way in order to describe aspects of the disclosure qualitatively. The method can be extended by one or more aspects described in association with above-described examples in accordance with the disclosure.

At step 46, a semiconductor device can be fabricated. The semiconductor device can comprise an RF chip and an RF antenna arranged in the semiconductor device. At step 48, the fabricated semiconductor device can be embedded into a printed circuit board.

In one specific example, the method in FIG. 11 can be used to fabricate the RF device 200 in FIG. 2. In this case, firstly the semiconductor package 28 can be fabricated. During fabrication, the RF chip 4 can be embedded into the encapsulation material 2. In this case, by way of example, one or more of the following techniques can be used: compression molding, injection molding, powder molding, liquid molding, etc. Afterward, the electrical redistribution layer 10 can be formed over the RF chip 4 and the encapsulation material 2. In this case, conductor tracks of the redistribution layer 10 can be produced for example by sputtering, electroless deposition, vapor deposition. Dielectric layers of the redistribution layer 10 can be vapor-deposited, deposited from a solution or laminated, for example. Patterning of the components of the redistribution layer 10 can be carried out for example using photolithographic processes, etching processes and/or laser drilling. During the production of the redistribution layer 10 or during the patterning of the electrically conductive structures of the redistribution layer 10, one or more RF antennas 12 can be formed in the redistribution layer 10. The RF antennas 12 and their electrical feeds within the redistribution layer 10 can be patterned finely and precisely in particular, through the use of the photolithographic processes.

The fabricated semiconductor package 28 can be embedded into the printed circuit board 26 during production of the printed circuit board 26. The one or more electrically conductive structures 32 and the dielectric layers 34 of the printed circuit board 26 can be formed one above another successively in the z-direction from bottom to top. After the topmost, inner electrically conductive structure 32B has been formed, the semiconductor package 28 can be mounted thereon, for example by way of a soldered or adhesive connection. The dielectric layer 34C can then be formed and encapsulate the semiconductor package 28.

In a further step, holes can be formed in the printed circuit board 26 or in the topmost dielectric layer 34C, wherein a conductor/metal layer 16 of the redistribution layer 10 or the electrical contact pads 20 of the semiconductor package 28 can be exposed. Forming the holes can comprise a laser process, for example, wherein the laser process can be stopped by the electrical contact pads 20. The fabricated holes can be filled with an electrically conductive material, which can electrically contact the contact pads 20. The electrically conductive material can form through contacts 36 extending perpendicularly, to electrically contact the contact pads 20 on the top side of the redistribution layer 10. In a further step, the electrically conductive contacts of the printed circuit board 26 that are arranged on the top side of the printed circuit board 26 can be formed.

In a further step, the waveguide component 30 having at least one waveguide 38 can be produced. The waveguide component 30 produced can be positioned over the top side of the printed circuit board 26 in such a way that the waveguide(s) 38 is/are aligned with the RF antennas 12 respectively assigned thereto. After alignment, the waveguide component 30 can be mounted on the mounting surface of the printed circuit board 26.

Figure 12:
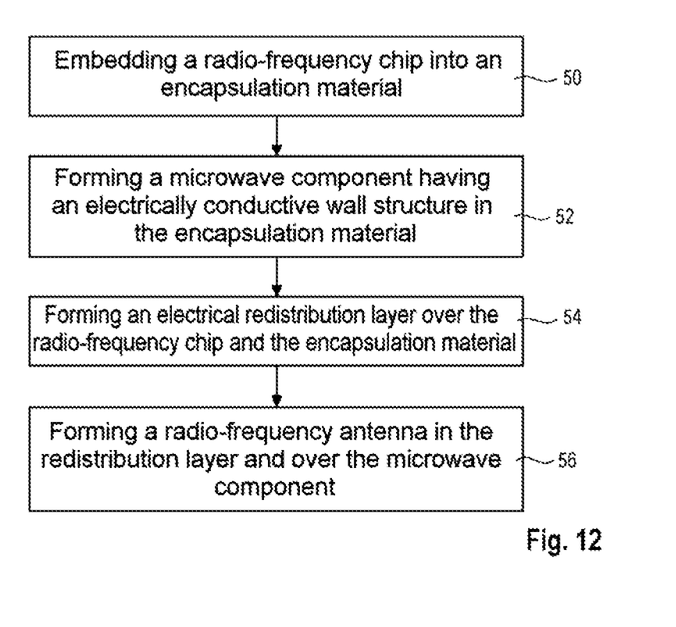
FIG. 12 shows a flow diagram of a method for producing an RF device in accordance with the disclosure.

FIG. 12 shows a flow diagram of a method for producing an RF device in accordance with the disclosure. By way of example, the RF device in FIG. 1 or one of the above-described semiconductor packages embedded into a printed circuit board can be produced by the method. The method is illustrated in a general way in order to describe aspects of the disclosure qualitatively. The method can be extended by one or more aspects described in association with above-described examples in accordance with the disclosure.

At step 50, an RF chip can be embedded into an encapsulation material. At step 52, a microwave component having an electrically conductive wall structure can be formed in the encapsulation material. At step 54, an electrical redistribution layer can be formed over the RF chip and the encapsulation material. At step 56, an RF antenna can be formed in the redistribution layer and over the microwave component.

Figure 13:
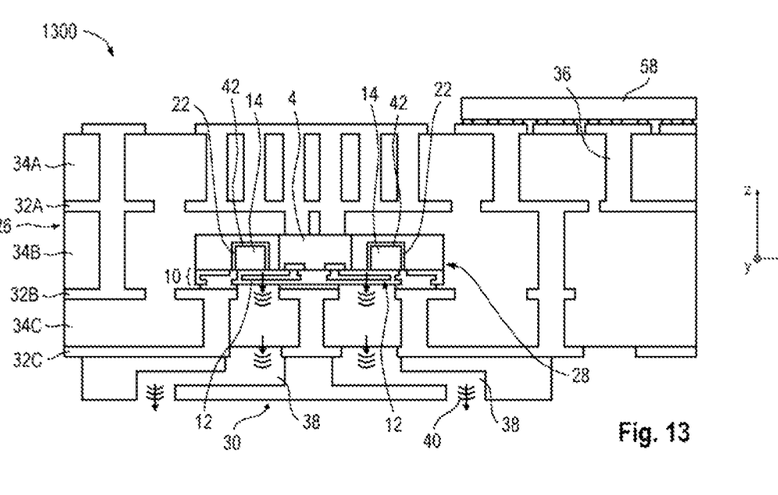
FIG. 13 schematically shows a cross-sectional side view of an RF device in accordance with the disclosure.

FIG. 13 schematically shows a cross-sectional side view of an RF device 1300 in accordance with the disclosure. The RF device 1300 can for example be at least partly similar to the RF device 200 in FIG. 2 and be turned upside down in comparison therewith. In contrast to the RF device 200 in FIG. 2, the RF device 1300 can be produced in a different way. A description of the order in which the layers of the printed circuit board 26 can be formed in the RF device 200 has been given in association with FIG. 11. In comparison therewith, in the case of the RF device 1300 in FIG. 13, the one or more electrically conductive structures 32 and the dielectric layers 34 of the printed circuit board 26 can be formed one above another in the opposite order. Relative to the view in FIG. 13, the layers of the printed circuit board 26 can be constructed successively from bottom to top in the z-direction. Accordingly, firstly the bottom-most dielectric layer 34C and the bottom-most one or more electrically conductive structures 32B, 32C can be formed. The semiconductor package 28 can be mounted on the top side of the bottom-most inner electrically conductive structure 32B and can be electrically coupled thereto. Afterward, the semiconductor package 28 can be embedded into the printed circuit board 26 by formation of the further layers of the printed circuit board 26. In the example in FIG. 13, the RF device 1300 can comprise one or more further electronic components 58, which can be mounted on the underside and/or top side of the printed circuit board 26.

Figure 14:
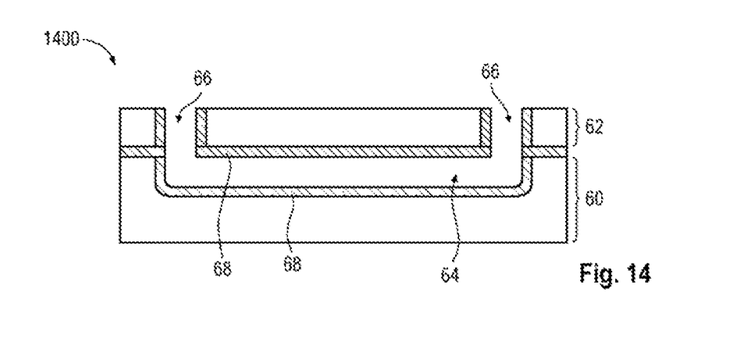
FIG. 14 schematically shows a cross-sectional side view of a multilayered injection-molded plastic assembly with an integrated hollow waveguide.

FIG. 14 schematically shows a cross-sectional side view of a multilayered injection-molded plastic assembly 1400 with an integrated hollow waveguide. By way of example, the waveguide components 30 from the figures described above can be embodied by a similar injection-molded plastic assembly. The injection-molded plastic assembly 1400 can comprise a first layer arrangement 60 and a second layer arrangement 62. Each of the layer arrangements 60 and 62 can comprise one or more layers, for example layers composed of a ceramic and/or dielectric material. The first layer arrangement 60 can have a cutout 64 extending horizontally, while the second layer arrangement 62 can have through holes 66 extending vertically through the second layer arrangement 62. The layer arrangements 60 and 62 can be aligned with one another such that the cutout 64 and the through holes 66 form a channel running continuously through the layer arrangements 60 and 62. The inner walls of the channel can be covered by a metallization 68 throughout. The channel with its metallized inner walls can thus form a hollow waveguide through the layer arrangements 60 and 62.

FIG. 14 illustrates by way of example a substantially horizontal direction of a hollow waveguide through a multilayered injection-molded plastic assembly 1400. Only part of the injection-molded plastic assembly 1400 is illustrated here. The injection-molded plastic assembly 1400 can have any desired number of further layer arrangements that can be structured and arranged one above another in such a way that one or more hollow waveguides with any desired combination of, in particular, horizontal and/or vertical sections can extend through the injection-molded plastic assembly 1400. Any desired direction of the hollow waveguide(s) through the injection-molded plastic assembly 1400 can be realized by a suitable combination of horizontal and/or vertical sections.

EXAMPLES

Radio-frequency devices and associated production methods are explained below based on examples.

Example 1 is a radio-frequency device, comprising: an encapsulation material; a radio-frequency chip embedded into the encapsulation material, wherein the radio-frequency chip has a first main surface and a second main surface; an electrical redistribution layer arranged over the first main surface of the radio-frequency chip and the encapsulation material; a radio-frequency antenna formed in the redistribution layer and configured to emit signals in a direction pointing from the second main surface to the first main surface and/or to receive signals in a direction pointing from the first main surface to the second main surface; and a microwave component having an electrically conductive wall structure, the microwave component being arranged below the radio-frequency antenna and embedded into the encapsulation material.

Example 2 is a radio-frequency device according to example 1, wherein the electrically conductive wall structure is formed by a multiplicity of metallized via holes.

Example 3 is a radio-frequency device according to example 1 or 2, wherein the microwave component forms a hollow waveguide extending at least partly into the encapsulation material.

Example 4 is a radio-frequency device according to any of the preceding examples, wherein the microwave component is an electromagnetic shield.

Example 5 is a radio-frequency device according to any of the preceding examples, wherein the microwave component and the radio-frequency antenna at least partly overlap in a plan view of one of the main surfaces of the radio-frequency chip.

Example 6 is a radio-frequency device according to any of the preceding examples, wherein the microwave component extends from a first main surface of the encapsulation material completely through the encapsulation material as far as a second main surface of the encapsulation material.

Example 7 is a radio-frequency device according to example 6, furthermore comprising: a metallization arranged on the second main surface of the encapsulation material, wherein the metallization forms a base surface of the microwave component.

Example 8 is a radio-frequency device according to any of examples 1 to 5, wherein the microwave component extends from a first main surface of the encapsulation material only partly into the encapsulation material, wherein the encapsulation material forms a base surface of the microwave component.

Example 9 is a radio-frequency device according to any of examples 1 to 5, wherein the microwave component extends from a first main surface of the encapsulation material only partly into the encapsulation material, wherein a base surface of the microwave component is formed by an electrically conductive material.

Example 10 is a radio-frequency device, comprising: a printed circuit board; and a semiconductor package embedded into the printed circuit board, comprising: an encapsulation material, a radio-frequency chip embedded into the encapsulation material, an electrical redistribution layer arranged over the radio-frequency chip and the encapsulation material, and a radio-frequency antenna formed in the redistribution layer.

Example 11 is a radio-frequency device according to example 10, wherein the semiconductor device furthermore comprises: a microwave component having an electrically conductive wall structure, the microwave component being arranged below the radio-frequency antenna and embedded into the encapsulation material.

Example 12 is a radio-frequency device according to example 10 or 11, wherein the radio-frequency antenna is configured to emit signals and/or to receive signals in a direction perpendicular to the redistribution layer.

Example 13 is a radio-frequency device according to example 10 or 11, wherein the radio-frequency antenna is configured to emit signals and/or to receive signals in a direction parallel to the redistribution layer.

Example 14 is a radio-frequency device according to any of examples 10 to 13, furthermore comprising: a waveguide component arranged over the printed circuit board, wherein the waveguide component comprises at least one waveguide, and wherein the radio-frequency antenna is configured to radiate signals into the at least one waveguide and/or to receive signals by way of the at least one waveguide.

Example 15 is a radio-frequency device according to example 14, wherein the waveguide component is formed in a multilayered injection-molded plastic assembly and the at least one waveguide comprises a metallized hollow waveguide formed in the injection-molded plastic assembly.

Example 16 is a radio-frequency device according to example 14 or 15, wherein the waveguide component is mounted on a mounting surface of the printed circuit board and mechanically contacts the mounting surface.

Example 17 is a radio-frequency device according to any of examples 14 to 16, wherein the at least one waveguide and the radio-frequency antenna at least partly overlap in a plan view of a main surface of the radio-frequency chip.

Example 18 is a radio-frequency device, comprising: a printed circuit board; a radio-frequency chip embedded into the printed circuit board without a package; and a radio-frequency antenna arranged on the radio-frequency chip.

Example 19 is a radio-frequency device according to example 18, furthermore comprising: a waveguide component arranged over the printed circuit board, wherein the waveguide component comprises at least one waveguide, and wherein the radio-frequency antenna is configured to radiate signals into the at least one waveguide and/or to receive signals by way of the at least one waveguide.

Example 20 is a method for producing a radio-frequency device, wherein the method comprises: fabricating a semiconductor device, comprising: a radio-frequency chip, and a radio-frequency antenna arranged in the semiconductor device; and embedding the fabricated semiconductor device into a printed circuit board.

Example 21 is a method according to example 20, wherein fabricating the semiconductor device furthermore comprises: embedding the radio-frequency chip into an encapsulation material, forming an electrical redistribution layer over the radio-frequency chip and the encapsulation material, and forming the radio-frequency antenna in the redistribution layer.

Example 22 is a method according to example 21, furthermore comprising: forming holes in the printed circuit board, wherein a conductor layer of the redistribution layer is exposed; and filling the holes with an electrically conductive material, wherein the electrically conductive material electrically contacts the conductor layer.

Example 23 is a method according to example 22, wherein forming the holes comprises a laser process, wherein the laser process is stopped by the conductor layer of the redistribution layer.

Example 24 is a method according to any of examples 20 to 23, furthermore comprising: producing a waveguide component having at least one waveguide; aligning the at least one waveguide with the radio-frequency antenna; and mounting the waveguide component on a mounting surface of the printed circuit board.

Example 25 is a method for producing a radio-frequency device, wherein the method comprises: embedding a radio-frequency chip into an encapsulation material; forming a microwave component having an electrically conductive wall structure in the encapsulation material; forming an electrical redistribution layer over the radio-frequency chip and the encapsulation material; and forming a radio-frequency antenna in the redistribution layer and over the microwave component.

Within the meaning of the present description, the terms "connected", "coupled", "electrically connected" and/or "electrically coupled" need not necessarily mean that components must be directly connected or coupled to one another. Intervening components can be present between the "connected", "coupled", "electrically connected" or "electrically coupled" components.

Furthermore, the words "over" and "on" used for example with respect to a material layer that is formed "over" or "on" a surface of an object or is situated "over" or "on" the surface can be used in the present description in the sense that the material layer is arranged (for example formed, deposited, etc.) "directly on", for example in direct contact with, the surface meant. The words "over" and "on" used for example with respect to a material layer that is formed or arranged "over" or "on" a surface can also be used in the present text in the sense that the material layer is arranged (e.g. formed, deposited, etc.) "indirectly on" the surface meant, wherein for example one or more additional layers are situated between the surface meant and the material layer.

Insofar as the terms "have", "contain", "encompass", "with" or variants thereof are used either in the detailed description or in the claims, these terms are intended to be inclusive in a similar manner to the term "comprise". That means that within the meaning of the present description the terms "have", "contain", "encompass", "with", "comprise" and the like are open terms which indicate the presence of stated elements or features but do not exclude further elements or features. The articles "a/an" or "the" should be understood such that they include the plural meaning and also the singular meaning, unless the context clearly suggests a different understanding.

Furthermore, the word "example" is used in the present text in the sense that it serves as an example, a case or an illustration. An aspect or a configuration that is described as "example" in the present text should not necessarily be understood in the sense as though it has advantages over other aspects or configurations. Rather, the use of the word "example" is intended to present concepts in a concrete manner. Within the meaning of this application, the term "or" does not mean an exclusive "or", but rather an inclusive "or". That is to say that, unless indicated otherwise or unless a different interpretation is allowed by the context, "X uses A or B" means each of the natural inclusive permutations. That is to say if X uses A, X uses B or X uses both A and B, then "X uses A or B" is fulfilled in each of the cases mentioned above. Moreover, the articles "a/an" can be interpreted within the meaning of this application and the accompanying claims generally as "one or more", unless it is expressly stated or clearly evident from the context that only a singular is meant. Furthermore, at least one from A or B or the like generally means A or B or both A and B.

Devices and methods for producing devices are described in the present description. Observations made in connection with a device described can also apply to a corresponding method, and vice versa. If a specific component of a device is described, for example, then a corresponding method for producing the device can contain an action for providing the component in a suitable manner, even if such an action is not explicitly described or illustrated in the figures. Moreover, the features of the various example aspects described in the present text can be combined with one another, unless expressly noted otherwise.

Although the disclosure has been shown and described with respect to one or more implementations, equivalent alterations and modifications based at least in part on the reading and understanding of this description and the accompanying drawings will be apparent to the person skilled in the art. The disclosure includes all such modifications and alterations and is restricted solely by the concept of the following claims. Especially with respect to the various functions that are implemented by the above-described components (for example elements, resources, etc.), the intention is that, unless indicated otherwise, the terms used for describing such components correspond to any components which implement the specified function of the described component (which is functionally equivalent, for example), even if it is not structurally equivalent to the disclosed structure which implements the function as presented herein. Furthermore, even if a specific feature of the disclosure has been disclosed with respect to only one of various implementations, such a feature can be combined with one or more other features of the other implementations in a manner such as is desired and advantageous for a given or specific application.

The invention claimed is:

1. A radio-frequency device, comprising:
an encapsulation material;
a radio-frequency chip embedded into the encapsulation material, wherein the radio-frequency chip has a first main surface and a second main surface;
an electrical redistribution layer arranged over the first main surface of the radio-frequency chip and the encapsulation material,
wherein a radio-frequency antenna is formed within the electrical redistribution layer and configured to at least one of:
emit signals in a direction pointing from the second main surface to the first main surface, or
receive signals in a direction pointing from the first main surface to the second main surface; and
a microwave component having an electrically conductive wall structure, the microwave component being arranged below the radio-frequency antenna and embedded into the encapsulation material.

2. The radio-frequency device as claimed in claim 1, wherein the electrically conductive wall structure is formed by a multiplicity of metallized via holes.

3. The radio-frequency device as claimed in claim 1, wherein the microwave component forms a hollow waveguide extending at least partly into the encapsulation material.

4. The radio-frequency device as claimed in claim 1, wherein the microwave component is an electromagnetic shield.

5. The radio-frequency device as claimed in claim 1, wherein the microwave component and the radio-frequency antenna at least partly overlap in a plan view of one of the first main surface of the radio-frequency chip or the second main surface of the radio frequency chip.

6. The radio-frequency device as claimed in claim 1, wherein the microwave component extends from a first main surface of the encapsulation material completely through the encapsulation material as far as a second main surface of the encapsulation material.

7. The radio-frequency device as claimed in claim 6, further comprising:
a metallization arranged on the second main surface of the encapsulation material, wherein the metallization forms a base surface of the microwave component.

8. The radio-frequency device as claimed in claim 1, wherein the microwave component extends from a first main surface of the encapsulation material only partly into the encapsulation material, wherein the encapsulation material forms a base surface of the microwave component.

9. The radio-frequency device as claimed in claim 1, wherein the microwave component extends from a first main surface of the encapsulation material only partly into the encapsulation material, wherein a base surface of the microwave component is formed by an electrically conductive material.

10. A radio-frequency device, comprising:
a printed circuit board; and
a semiconductor package embedded within the printed circuit board, comprising:
an encapsulation material;
a radio-frequency chip embedded into the encapsulation material; and an electrical redistribution layer arranged over the radio-frequency chip and the encapsulation material, wherein a radio-frequency antenna is formed within the electrical redistribution layer.

11. The radio-frequency device as claimed in claim 10, wherein the semiconductor package further comprises:
a microwave component having an electrically conductive wall structure, the microwave component being arranged below the radio-frequency antenna and embedded into the encapsulation material.

12. The radio-frequency device as claimed in claim 10, wherein the radio-frequency antenna is configured to at least one of emit signals or receive signals in a direction perpendicular to the electrical redistribution layer.

13. The radio-frequency device as claimed in claim 10, wherein the radio-frequency antenna is configured to at least one of emit signals or receive signals in a direction parallel to the electrical redistribution layer.

14. The radio-frequency device as claimed in claim 10, further comprising:
a waveguide component arranged over the printed circuit board,
wherein the waveguide component comprises at least one waveguide, and
wherein the radio-frequency antenna is configured to at least one of radiate signals into the at least one waveguide or receive signals by way of the at least one waveguide.

15. The radio-frequency device as claimed in claim 14, wherein the waveguide component is formed in a multilayered injection-molded plastic assembly and the at least one waveguide comprises a metallized hollow waveguide formed in the injection-molded plastic assembly.

16. The radio-frequency device as claimed in claim 14, wherein the waveguide component is mounted on a mounting surface of the printed circuit board and mechanically contacts the mounting surface.

17. The radio-frequency device as claimed in claim 14, wherein the at least one waveguide and the radio-frequency antenna at least partly overlap in a plan view of a main surface of the radio-frequency chip.

18. A radio-frequency device, comprising:
a printed circuit board;
a radio-frequency chip embedded within the printed circuit board without a package; and
a radio-frequency antenna arranged on the radio-frequency chip.

19. The radio-frequency device as claimed in claim 18, further comprising:
a waveguide component arranged over the printed circuit board,
wherein the waveguide component comprises at least one waveguide, and
wherein the radio-frequency antenna is configured to at least one of radiate signals into the at least one waveguide or receive signals by way of the at least one waveguide.

20. A method for producing a radio-frequency device, wherein the method comprises:
fabricating a semiconductor device, comprising:
a radio-frequency chip; and
a radio-frequency antenna arranged within the semiconductor device; and
embedding the fabricated semiconductor device within a printed circuit board.

21. The method as claimed in claim 20, wherein fabricating the semiconductor device further comprises:
embedding the radio-frequency chip into an encapsulation material; and
forming an electrical redistribution layer over the radio-frequency chip and the encapsulation material,
wherein the radio-frequency antenna is formed within the electrical redistribution layer.

22. The method as claimed in claim 21, further comprising:
forming holes in the printed circuit board, wherein a conductor layer of the electrical redistribution layer is exposed; and
filling the holes with an electrically conductive material, wherein the electrically conductive material electrically contacts the conductor layer.

23. The method as claimed in claim 22, wherein forming the holes comprises a laser process, wherein the laser process is stopped by the conductor layer of the electrical redistribution layer.

24. The method as claimed in claim 20, further comprising:
producing a waveguide component having at least one waveguide;
aligning the at least one waveguide with the radio-frequency antenna; and
mounting the waveguide component on a mounting surface of the printed circuit board.

25. A method for producing a radio-frequency device, wherein the method comprises:
embedding a radio-frequency chip into an encapsulation material;
forming a microwave component having an electrically conductive wall structure in the encapsulation material;
forming an electrical redistribution layer over the radio-frequency chip and the encapsulation material,
wherein a radio-frequency antenna is formed within the electrical redistribution layer and over the microwave component.

* * * * *